(12) United States Patent
Hunt

(10) Patent No.: US 12,366,901 B2
(45) Date of Patent: Jul. 22, 2025

(54) ORGANIC LIGHT EMITTING DIODE (OLED) DISPLAY AND METHOD OF PRODUCING OLED DISPLAY

(71) Applicant: Telefonaktiebolaget LM Ericsson (publ), Stockholm (SE)

(72) Inventor: Alexander Hunt, Tygelsjö (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 18/437,462

(22) Filed: Feb. 9, 2024

(65) Prior Publication Data

US 2024/0188327 A1 Jun. 6, 2024

Related U.S. Application Data

(63) Continuation of application No. 17/291,649, filed as application No. PCT/EP2018/080428 on Nov. 7, 2018, now Pat. No. 11,903,248.

(51) Int. Cl.

| | |
|---|---|
| *H10K 59/121* | (2023.01) |
| *G06F 1/16* | (2006.01) |
| *H10K 59/65* | (2023.01) |
| *H10K 71/00* | (2023.01) |
| *H10K 50/856* | (2023.01) |

(Continued)

(52) U.S. Cl.
CPC ......... *G06F 1/1684* (2013.01); *H10K 59/121* (2023.02); *H10K 59/65* (2023.02); *H10K 71/00* (2023.02); *H10K 50/856* (2023.02); *H10K 50/86* (2023.02); *H10K 59/17* (2023.02)

(58) Field of Classification Search
CPC .................................................. H10K 59/121
See application file for complete search history.

(56) References Cited

U.S. PATENT DOCUMENTS

| | | |
|---|---|---|
| 2006/0152531 A1 | 7/2006 | Lin et al. |
| 2014/0252317 A1 | 9/2014 | Gupta et al. |

(Continued)

FOREIGN PATENT DOCUMENTS

| | | |
|---|---|---|
| CN | 107633802 A | 1/2018 |
| CN | 108520888 A | 9/2018 |

(Continued)

OTHER PUBLICATIONS

Patentability Examination Search Report for NC2021/0007306, Official Letter No. 19547, Nov. 30, 2023, p. 9.

*Primary Examiner* — Douglas M Menz
(74) *Attorney, Agent, or Firm* — COATS & BENNETT, PLLC

(57) ABSTRACT

In one example aspect, a device comprises an organic light emitting diode (OLED) display. The display comprises a transparent or semi-transparent substrate and includes a first region comprising a plurality of first pixels and a second region comprising a plurality of second pixels. A first proportion of each first pixel comprises a first light emissive area, a second proportion of each second pixel comprises a second light emissive area, and the first proportion is different to the second proportion, wherein the first proportion comprises a ratio of a size of the first light emissive area to a size of each first pixel, and the second proportion comprises a ratio of a size of the second light emissive area to a size of each second pixel.

19 Claims, 3 Drawing Sheets

(51) Int. Cl.
    *H10K 50/86* (2023.01)
    *H10K 59/17* (2023.01)

(56) References Cited

U.S. PATENT DOCUMENTS

| | | |
|---|---|---|
| 2014/0312321 A1 | 10/2014 | Yoo et al. |
| 2016/0343948 A1 | 11/2016 | Salcedo Reyes et al. |
| 2017/0292681 A1 | 10/2017 | Lin et al. |
| 2018/0096188 A1 | 4/2018 | Xu |
| 2018/0129328 A1* | 5/2018 | Park .................. G06F 3/0412 |
| 2018/0129852 A1 | 5/2018 | Zeng et al. |
| 2020/0105843 A1* | 4/2020 | Baek .................. H10K 50/813 |
| 2020/0127061 A1 | 4/2020 | Zou |
| 2020/0203445 A1 | 6/2020 | Ou et al. |

FOREIGN PATENT DOCUMENTS

| | | |
|---|---|---|
| CN | 108766990 A | 11/2018 |
| CO | 6870008 A1 | 2/2014 |
| KR | 20170024182 A | 3/2017 |
| WO | 2017075469 A1 | 5/2017 |
| WO | 2019080591 A1 | 5/2019 |

\* cited by examiner

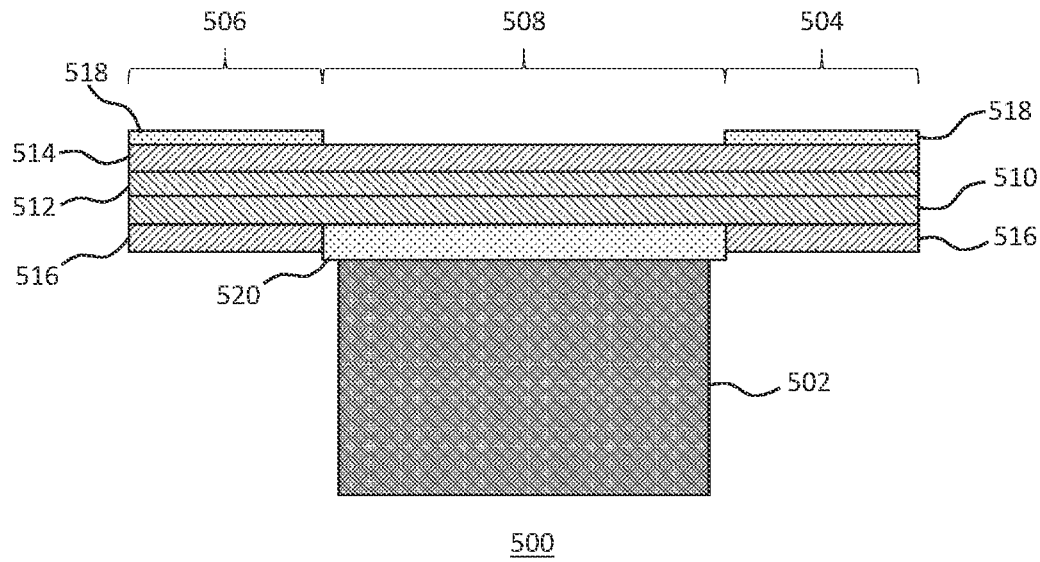

FIG. 5

Forming, on a transparent or semi-transparent substrate, a first region comprising a plurality of first pixels and a second region comprising a plurality of second pixels, wherein a first proportion of each first pixel comprises a light emitting area, a second proportion of each second pixel comprises a light emitting area, and the first proportion is different to the second proportion

FIG. 6

ORGANIC LIGHT EMITTING DIODE (OLED) DISPLAY AND METHOD OF PRODUCING OLED DISPLAY

RELATED APPLICATIONS

This application is a continuation of prior U.S. application Ser. No. 17/291,649, filed 6 May 2021, which was the National Stage of International Application PCT/EP2018/080428 filed 7 Nov. 2018, the entire disclosure of each being hereby incorporated by reference herein.

TECHNICAL FIELD

Examples of the present disclosure relate to an organic light emitting diode (OLED) display and a method of producing an OLED display.

BACKGROUND

OLED displays are used in a wide range of devices to display text and images to a user. Some devices may include one or more optoelectronic components that face the user, such as a sensor or light source. A typical OLED display is not transparent or is only partially transparent, allowing only around 4-5% of light to pass through. Therefore, the OLED display in such devices is designed so that it does not cover the optoelectronic components. As the size of the display increases relative to the size of the device, the display may include one or more cutouts or "notches" to accommodate the optoelectronic components.

SUMMARY

One aspect of the present disclosure provides a device comprising an organic light emitting diode (OLED) display. The display comprises a transparent or semi-transparent substrate and includes a first region comprising a plurality of first pixels and a second region comprising a plurality of second pixels. A first proportion of each first pixel comprises a first light emissive area, a second proportion of each second pixel comprises a second light emissive area, and the first proportion is different to the second proportion, wherein the first proportion comprises a ratio of a size of the first light emissive area to a size of each first pixel, and the second proportion comprises a ratio of a size of the second light emissive area to a size of each second pixel.

Another aspect of the present disclosure provides a method of producing an organic light emitting diode (OLED) display. The method comprises forming, on a transparent or semi-transparent substrate, a first region comprising a plurality of first pixels and a second region comprising a plurality of second pixels. A first proportion of each first pixel comprises a first light emissive area, a second proportion of each second pixel comprises a second light emissive area, and the first proportion is different to the second proportion. The first proportion comprises a ratio of a size of the first light emissive area to a size of each first pixel, and the second proportion comprises a ratio of a size of the second light emissive area to a size of each second pixel.

BRIEF DESCRIPTION OF THE DRAWINGS

For a better understanding of examples of the present disclosure, and to show more clearly how the examples may be carried into effect, reference will now be made, by way of example only, to the following drawings in which:

FIG. 5 is a cross section of a portion of an example display; and

FIG. 6 is a flow chart of an example of a method 600 of producing an OLED display.

DETAILED DESCRIPTION

The following sets forth specific details, such as particular embodiments or examples for purposes of explanation and not limitation. It will be appreciated by one skilled in the art that other examples may be employed apart from these specific details. In some instances, detailed descriptions of well-known methods, nodes, interfaces, circuits, and devices are omitted so as not obscure the description with unnecessary detail. Those skilled in the art will appreciate that the functions described may be implemented in one or more nodes using hardware circuitry (e.g., analog and/or discrete logic gates interconnected to perform a specialized function, ASICs, PLAs, etc.) and/or using software programs and data in conjunction with one or more digital microprocessors or general purpose computers. Nodes that communicate using the air interface also have suitable radio communications circuitry. Moreover, where appropriate the technology can additionally be considered to be embodied entirely within any form of computer-readable memory, such as solid-state memory, magnetic disk, or optical disk containing an appropriate set of computer instructions that would cause a processor to carry out the techniques described herein.

Some embodiments described herein may increase the display size or coverage in a device by placing one or more optoelectronic components behind an organic light emitting diode (OLED) display. In some embodiments, a display may have a higher light transmittance in a region where the one or more optoelectronic components are located compared to other regions of the display.

Figure 1:
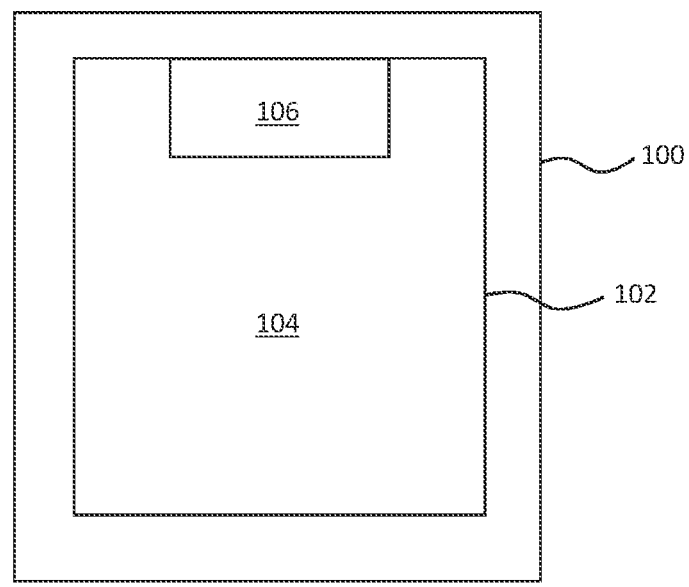
FIG. 1 is a schematic of an example of a device comprising an organic light emitting diode (OLED) display.

FIG. 1 is a schematic of an example of a device 100 comprising an organic light emitting diode (OLED) display 102, such as for example an active matrix OLED (AMOLED) or passive matrix OLED (PMOLED) display. The display 102 comprises a transparent or semi-transparent substrate and includes a first region 104 comprising a plurality of first pixels and a second region 106 comprising a plurality of second pixels. The device 100 in some examples may comprise a communication device or user equipment (UE).

Figure 2:
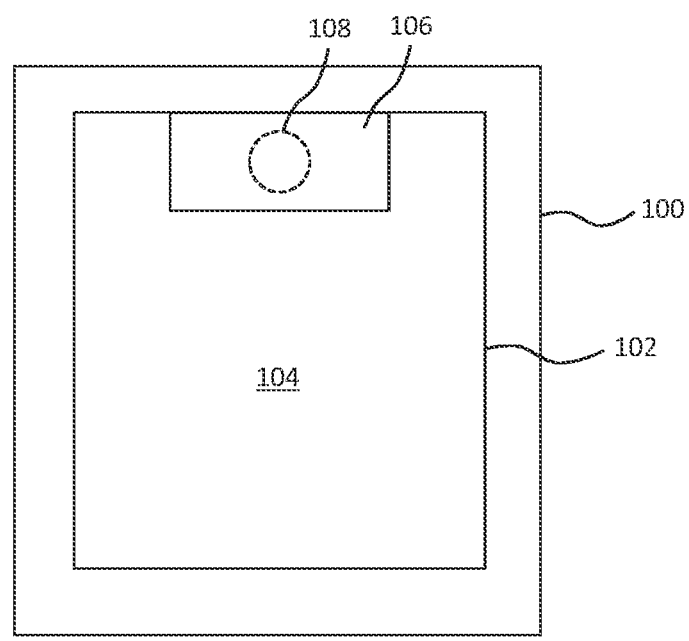
FIG. 2 is a schematic of an example of the device of FIG. 1 including an optoelectronic component.

In some examples, one or more optoelectronic components 108 may be located underneath the second region 106, as shown in FIG. 2, which shows the device 100 of FIG. 1 including an optoelectronic component 108. In some examples, "underneath" means that the second region 106 of the display, or at least part of the second region 106, is between the user or viewer of the device 100 and the optoelectronic component 108 or at least part of the optoelectronic component. The device 100 may include one or more optoelectronic components 108 located underneath the second region 106. In some examples, each optoelectronic component may be a sensor such as for example a camera, light sensor, proximity sensor, or optical fingerprint reader, and/or a light source (e.g. a visible or infrared, IR, light source).

A first proportion of each first pixel comprises a first light emissive area, a second proportion of each second pixel comprises a second light emissive area, and the first proportion is different to the second proportion, wherein the first proportion comprises a ratio of a size of the first light emissive area to a size of each first pixel, and the second proportion comprises a ratio of a size of the second light emissive area to a size of each second pixel. In some examples, at least part of each first and second pixel that does not comprise the respective light emissive area is transparent or semi-transparent, due to the transparent or semi-transparent substrate of the OLED display 102. Therefore, for example, the second region 106 of the display 102 may let through more light than the first region 104.

The regions 104 and 106 of the device 100 shown in FIGS. 1 and 2 are single rectangular regions. However, in other examples, the regions may be of any shape, and each region may also comprise parts that are not contiguous with each other.

Figure 3:
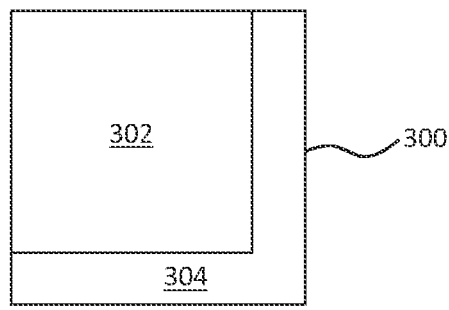
FIG. 3 shows an example of a pixel that may be located in a first region of an OLED display.

FIG. 3 shows an example of a pixel 300 that may be located in the first region 104, and thus may be a first pixel. The first pixel 300 comprises a light emissive area 302 and an area 304 that does not comprise light emissive material. At least some of the area 304 may be transparent or semi-transparent. For example, at least part of the area 304 may not include components and connectors such as pixel drive electronics or traces, and thus the transparent or semi-transparent substrate may be exposed. In some examples, each of the first and second pixels comprises respective pixel drive electronics at least partially covered by the respective light emissive area.

Figure 4:
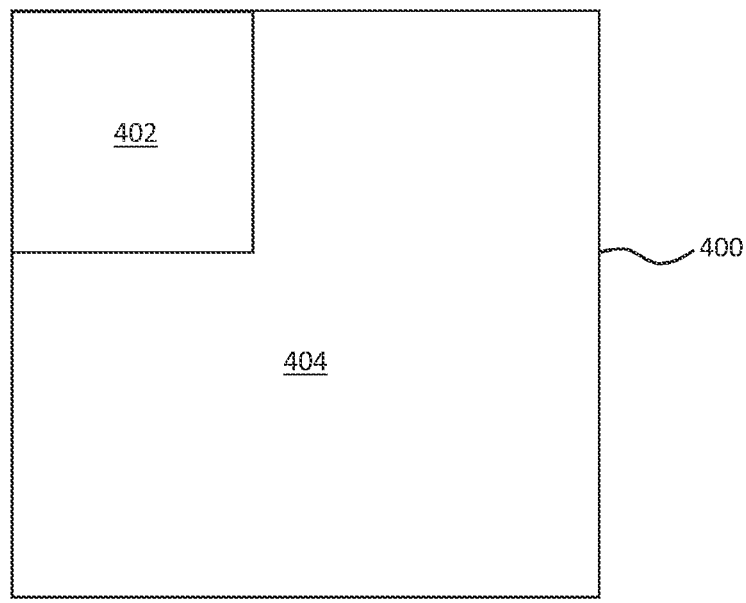
FIG. 4 shows an example of a pixel that may be located in a second region of an OLED display.

FIG. 4 shows an example of a pixel 400 that may be located in the second region 106, and thus may be a second pixel. The second pixel 400 comprises a light emissive area 402 and an area 404 that does not comprise light emissive material. At least some of the area 404 may be transparent or semi-transparent. For example, at least part of the area 404 may not include components and connectors such as pixel drive electronics or traces, and thus the transparent or semi-transparent substrate may be exposed. It can be seen that the area 404 comprises a greater proportion of the second pixel 400 than the area 304 of the first pixel 300. That is, for example, a third proportion of each first pixel comprises a transparent or semi-transparent area, a fourth proportion of each second pixel comprises a transparent or semi-transparent area, and the third proportion is different to the fourth proportion. As a result, for example, each second pixel 400 (and thus a collection of second pixels, such as for example in the region 106) may allow more light to pass through than each first pixel 300 (and thus a collection of first pixels, such as for example in the region 104). Thus, for example, as a result of the second pixels allowing more light to pass through than the first pixels, the first proportion may be higher than the second proportion.

In the example pixels 300 and 400 shown in FIGS. 3 and 4 respectively, each pixel is shown as square and includes a square light emissive area. However, in other examples the pixels may have other shapes. Additionally or alternatively, the light emissive areas may have different shapes and/or may comprise non-contiguous parts.

In some examples, the size of each first pixel is smaller than the size of each second pixel. In such examples, the resolution of the display 102 in the first region 104 is higher than the resolution in the second region 106. This may lead to a different appearance of the display 102 in the first region 104 as compared to the second region 106. However, the second region 106 may be located in an area of the display 102 that displays certain information, such as for example a digital clock, wireless connection information and/or other information using text and/or simple graphics. As such, the lower resolution of the second region 106 may have little or no impact on the overall appearance of the display 102.

In some examples, the size of the light emissive area of the first and second pixels respectively may be substantially the same. That is, for example, the size of the light emissive area 302 of the first pixels 300 may be the same as the size of the light emissive area 402 of the second pixels 400. In such cases, the same stencil or stencils may be used in some examples of a manufacturing process to produce the first and second light emissive areas. The transparent or semi-transparent area 304 of the first pixel 300 may in some examples be smaller in size (area) than the area 404 of the second pixel 400. However, in other examples, the light emissive areas 302 or 402 may be different sizes.

FIG. 5 is a cross section of a portion of an example display 500, such as for example the display 102 shown in FIGS. 1 and 2. Also shown is an optoelectronic component 502, such as for example the optoelectronic component 108 shown in FIGS. 1 and 2.

The display 500 includes a first region, at least part 504 of which is shown in FIG. 5. Another part 506 of the display may also be part of the first region. The display 500 also includes a second region, at least part 508 of which is shown in FIG. 5.

The display 500 comprises a transparent or semi-transparent substrate 510, and an OLED layer 512 that includes the pixels of the display 500, such as first and second pixels, e.g. as shown in FIGS. 3 and 4. The OLED layer may include, for example, light emissive material as well as drive electronics and electronic traces. The display 500 also includes a protection layer 514 such as plastic or glass. A reflective layer 516 is included underneath the substrate 510. A circular polarizer layer 518 (e.g. a linear polarizer and quarter wave plate) is provided above the protective layer 514. The circular polarizer layer 518 and reflective layer 516 together reduce the reflection of ambient light by the display 500. The reflective layer 516 may also increase the efficiency of the display 500 by reflecting light from the OLED layer 512.

In some examples, for example in the display 500 as shown in FIG. 5, a part of one or more layers are omitted in the second region 508. For example, the reflective layer 516 and the circular polarizer 518 are omitted in at least part of the second region 508, in an area that is over the optoelectronic component 502. Thus in some examples the reflective layer 516 and the circular polarizer 518 do not prevent or reduce light from reaching or being emitted from the optoelectronic component 502.

The display 500 may also include a transparent or semi-transparent bonding or adhesive layer 520 between the optoelectronic component and the substrate 510, for example in a region where the reflective layer 516 is omitted.

FIG. 6 is a flow chart of an example of a method 600 of producing an organic light emitting diode (OLED) display, such as for example the display 100 shown in FIGS. 1 and 2, of the display 500 shown in FIG. 5. The method 600 comprises forming 602, on a transparent or semi-transparent substrate, a first region comprising a plurality of first pixels and a second region comprising a plurality of second pixels. A first proportion of each first pixel comprises a first light emissive area, a second proportion of each second pixel comprises a second light emissive area, and the first proportion is different to the second proportion. The first proportion comprises a ratio of a size of the first light emissive area to a size of each first pixel, and the second proportion comprises a ratio of a size of the second light emissive area to a size of each second pixel.

In some examples, the first proportion is higher than the second proportion. The size of each first pixel may be smaller than the size of each second pixel. Additionally or alternatively, the size of the first light emissive area of each first pixel may be larger than the size of the second light emissive area of each second pixel. Each of the first and second light emissive areas of each of the first and second pixels respectively may comprise an area of organic light emissive material.

In some examples, the second pixels may be larger. In such cases, the size of the second light emissive area in each second pixel may be larger than the size of the first light emissive area in each first pixel, for example to at least partially compensate for any drop in luminosity of the second region of the display (e.g. for a particular drive voltage) compared to the first region due to having a lower resolution in the second region. However, in such examples, the first proportion may still be higher than the second proportion.

In some examples, a third proportion of each first pixel comprises a transparent or semi-transparent area, a fourth proportion of each second pixel comprises a transparent or semi-transparent area, and the third proportion is different to the fourth proportion. Thus the method 600 may in some examples include forming the transparent or semi-transparent areas accordingly.

Each of the first and second pixels comprises respective pixel drive electronics at least partially covered by the respective light emissive area.

In some examples, the method 600 may comprise providing a circular polarizer over at least part of the first region. This may in some examples comprise omitting the circular polarizer over at least part of the second region. Additionally or alternatively, the method 600 may in some examples comprise providing a light reflective layer under at least part of the first region. This may in some examples comprise omitting the light reflective layer under at least part of the second region.

It should be noted that the above-mentioned examples illustrate rather than limit the invention, and that those skilled in the art will be able to design many alternative examples without departing from the scope of the appended statements. The word "comprising" does not exclude the presence of elements or steps other than those listed in a claim, "a" or "an" does not exclude a plurality, and a single processor or other unit may fulfil the functions of several units recited in the statements below. Where the terms, "first", "second" etc. are used they are to be understood merely as labels for the convenient identification of a particular feature. In particular, they are not to be interpreted as describing the first or the second feature of a plurality of such features (i.e. the first or second of such features to occur in time or space) unless explicitly stated otherwise. Steps in the methods disclosed herein may be carried out in any order unless expressly otherwise stated. Any reference signs in the statements shall not be construed so as to limit their scope.

What is claimed is:

1. A device comprising an organic light emitting diode (OLED) display,
wherein the display comprises a transparent or semi-transparent substrate and on the substrate the display includes a first region comprising a plurality of first pixels and a second region comprising a plurality of second pixels, wherein a first proportion of each first pixel comprises a first light emissive area, a second proportion of each second pixel comprises a second light emissive area, and the first proportion is different to the second proportion,
wherein the first proportion comprises a ratio of a size of the first light emissive area to a size of each first pixel, and the second proportion comprises a ratio of a size of the second light emissive area to a size of each second pixel, wherein the size of each first pixel is smaller than the size of each second pixel, and wherein the size of the first light emissive area of each first pixel is larger than the size of the second light emissive area of each second pixel.

2. The device of claim 1, wherein the first proportion is higher than the second proportion.

3. The device of claim 2, further comprising an optoelectronic component underneath the second region.

4. The device of claim 3, wherein the optoelectronic component comprises a camera, light sensor, proximity sensor, light source, or optical fingerprint reader.

5. The device of claim 3, comprising a layer of optically clear adhesive or optically clear resin between the optoelectronic component and at least a portion of the second region of the OLED display.

6. The device of claim 1, wherein the each of the first and second light emissive areas of each of the first and second pixels, respectively, comprises an area of organic light emissive material.

7. The device of claim 1, wherein a third proportion of each first pixel comprises a transparent or semi-transparent area, a fourth proportion of each second pixel comprises a transparent or semi-transparent area, and the third proportion is different to the fourth proportion.

8. The device of claim 1, wherein each of the first and second pixels comprises respective pixel drive electronics at least partially covered by the respective light emissive area.

9. The device of claim 1, wherein the display comprises a circular polarizer over at least part of the first region.

10. The device of claim 9, wherein the circular polarizer is not over at least part of the second region.

11. The device of claim 1, wherein the display comprises a light reflective layer under at least part of the first region.

12. The device of claim 11, wherein the light reflective layer is not under at least part of the second region.

13. The device of claim 1, wherein the display comprises an active matrix OLED (AMOLED) display or a passive matrix OLED (PMOLED) display.

14. The device of claim 1, wherein the device comprises a communication device or User Equipment (UE).

15. A method of producing an organic light emitting diode (OLED) display, the method comprising:
forming, on a transparent or semi-transparent substrate, a first region comprising a plurality of first pixels and a second region comprising a plurality of second pixels, wherein a first proportion of each first pixel comprises a first light emissive area, a second proportion of each second pixel comprises a second light emissive area, and the first proportion is different to the second proportion, wherein the first proportion comprises a ratio of a size of the first light emissive area to a size of each first pixel, and the second proportion comprises a ratio of a size of the second light emissive area to a size of each second pixel, wherein the size of each first pixel is smaller than the size of each second pixel, wherein the size of the first light emissive area of each first pixel is larger than the size of the second light emissive area of each second pixel.

16. The method of claim 15, further comprising providing a circular polarizer over at least part of the first region.

17. The method of claim 16, further comprising omitting the circular polarizer over at least part of the second region.

18. The method of claim 15, comprising providing a light reflective layer under at least part of the first region.

19. The method of claim 18, comprising omitting the light reflective layer under at least part of the second region.

* * * * *